(12) United States Patent
Kato et al.

(10) Patent No.: US 9,627,734 B2
(45) Date of Patent: Apr. 18, 2017

(54) HIGH-FREQUENCY SIGNAL LINE AND METHOD FOR PRODUCING BASE LAYER WITH SIGNAL LINE

(71) Applicant: Murata Manufacturing Co., Ltd., Nagaokakyo-shi, Kyoto-fu (JP)

(72) Inventors: Noboru Kato, Nagaokakyo (JP); Satoshi Ishino, Nagaokakyo (JP); Jun Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 143 days.

(21) Appl. No.: 14/531,058

(22) Filed: Nov. 3, 2014

(65) Prior Publication Data
US 2015/0048906 A1    Feb. 19, 2015

Related U.S. Application Data

(63) Continuation of application No. PCT/JP2013/066374, filed on Jun. 13, 2013.

(30) Foreign Application Priority Data

Jun. 29, 2012  (JP) .................. 2012-147300

(51) Int. Cl.
*H01P 3/08* (2006.01)
*H01P 5/02* (2006.01)
(Continued)

(52) U.S. Cl.
CPC .................. *H01P 3/08* (2013.01); *H01P 3/02* (2013.01); *H01P 3/085* (2013.01); *H01P 5/028* (2013.01); *H01P 11/003* (2013.01); *H05K 1/0225* (2013.01); *H05K 1/0253* (2013.01); *H05K 1/028* (2013.01); *H05K 1/0219* (2013.01); *H05K 1/0242* (2013.01); *H05K 1/0393* (2013.01); *H05K 1/113* (2013.01); *H05K 1/147* (2013.01); *H05K 2201/0969* (2013.01);
(Continued)

(58) Field of Classification Search
CPC .................................. H01P 3/08; H01P 3/085
USPC ......................................................... 333/238
See application file for complete search history.

(56) References Cited

U.S. PATENT DOCUMENTS

| | | | | |
|---|---|---|---|---|
| 4,801,489 A | * | 1/1989 | Nakagawa | ........... H05K 1/0218 156/297 |
| 2009/0195327 A1 | * | 8/2009 | Cho | ........................ H01P 3/003 333/34 |

(Continued)

FOREIGN PATENT DOCUMENTS

| JP | 2005-228795 A | 8/2005 |
|---|---|---|
| JP | 2011-147083 A | 7/2011 |

(Continued)

OTHER PUBLICATIONS

Official Communication issued in International Patent Application No. PCT/JP2013/066374 mailed on Sep. 10, 2013.

*Primary Examiner* — Stephen E Jones
(74) *Attorney, Agent, or Firm* — Keating & Bennett, LLP

(57) ABSTRACT

A high-frequency signal line includes a first base layer having flexibility, a linear signal line provided on the first base layer and including a first line portion having a first width and a second line portion having a second width greater than the first width, and a first reinforcing conductor provided on the first base layer along the first line portion.

7 Claims, 10 Drawing Sheets

(51) Int. Cl.
*H01P 11/00* (2006.01)
*H01P 3/02* (2006.01)
*H05K 1/02* (2006.01)
*H05K 1/03* (2006.01)
*H05K 1/11* (2006.01)
*H05K 1/14* (2006.01)

(52) U.S. Cl.
CPC .............. *H05K 2201/09454* (2013.01); *H05K 2201/09618* (2013.01); *H05K 2201/09727* (2013.01); *Y10T 29/49123* (2015.01)

(56) References Cited

U.S. PATENT DOCUMENTS

2009/0284333 A1\* 11/2009 Dolmans ................ H01P 5/028
 333/254
2012/0097433 A1 4/2012 Kato et al.

FOREIGN PATENT DOCUMENTS

JP 3173143 U 1/2012
WO 2011/007660 A1 1/2011

\* cited by examiner

F I G. 7
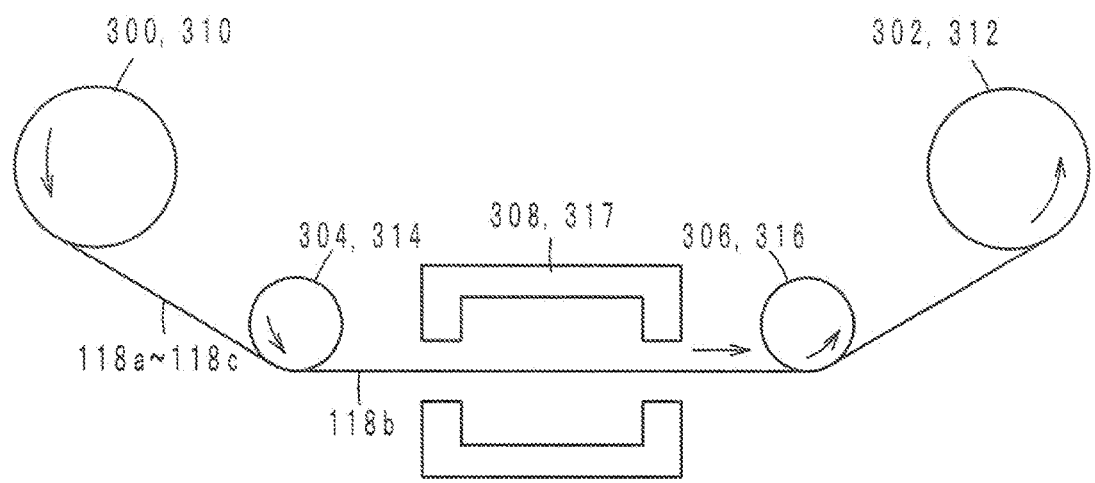
F I G. 8
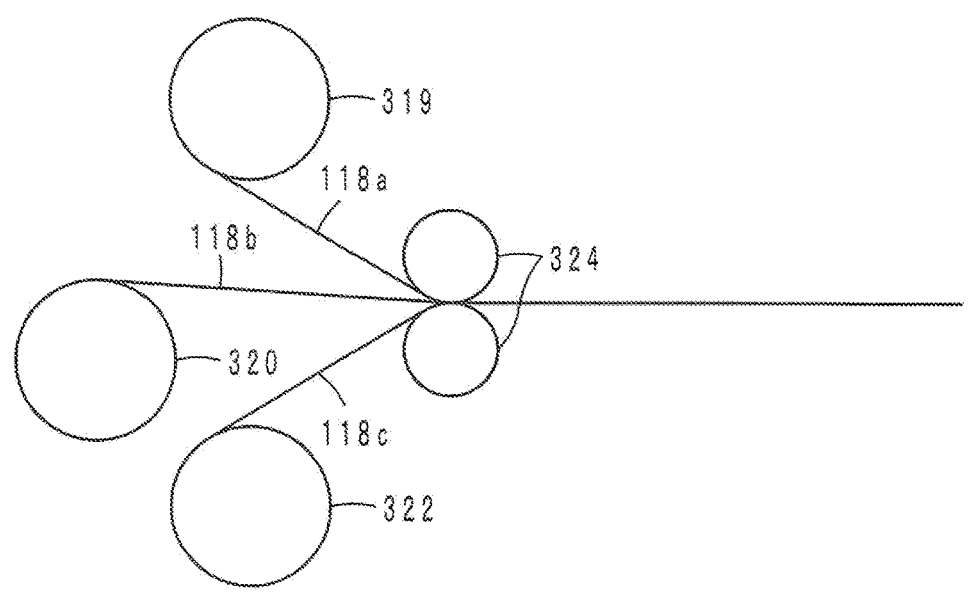

US 9,627,734 B2

HIGH-FREQUENCY SIGNAL LINE AND METHOD FOR PRODUCING BASE LAYER WITH SIGNAL LINE

This application is based on Japanese Patent Application No. 2012-147300 filed on Jun. 29, 2012, and International Application No. PCT/JP2013/066374 filed on Jun. 13, 2013, the entire contents of each of which is incorporated herein by reference.

BACKGROUND OF THE INVENTION

1. Field of the Invention

The present invention relates to high-frequency signal lines and methods for producing base layers with signal lines, and more particularly, the present invention relates to a flexible high-frequency signal line and a method for producing a base layer with a signal line.

2. Description of the Related Art

As a conventional high-frequency signal line, a high-frequency signal line described in, for example, Japanese Utility Model No. 3173143, is known. FIG. 11 is an exploded view of the high-frequency signal line 500 described in Japanese Utility Model No. 3173143.

The high-frequency signal line 500 includes a laminate 502, a signal line 506, and ground conductors 508 and 510, as shown in FIG. 11. The laminate 502 is formed by laminating dielectric sheets 504a to 504c. The signal line 506 is provided on the dielectric sheet 504b. The ground conductors 508 and 510 are provided on the dielectric sheets 504a and 504c, respectively. Accordingly, the signal line 506 is positioned between the ground conductors 508 and 510 in the vertical direction. That is, the signal line 506 and the ground conductors 508 and 510 form a stripline structure.

Furthermore, the ground conductor 508 has a plurality of openings 512 overlapping with the signal line 506. Moreover, the overlap of the signal line 506 with the opening 512 is wider than the overlap of the signal line 506 with the ground conductor 508.

Incidentally, in the case of the high-frequency signal line 500 described in Japanese Utility Model No. 3173143, the signal line 506 is prone to breakage, as will be described below. More specifically, at the time of production of the high-frequency signal line 500, a large-sized mother dielectric sheet having its entire surface coated with a conductor film is wound on a supply roll. The conductor film is patterned between the supply roll and a take-up roll while the mother dielectric sheet is being wound up on the take-up roll. As a result, a plurality of signal lines 506 are formed on the mother dielectric sheet.

Here, there is a tensile force generated between the supply roll and the take-up roll. Accordingly, in the case where the signal lines 506 extend parallel to the direction in which the mother dielectric sheet is transported, the signal lines 506 are pulled in directions in which they can be stretched. The signal line 506 has narrow and wide portions. The signal line 506 can be stretched in the narrow portions more than in the wide portions. On the other hand, the signal line 506 has less strength in the narrow portions than in the wide portions. Therefore, when the signal line 506 is pulled in directions in which it can be stretched, the signal line 506 might be broken in narrow portions.

SUMMARY OF THE INVENTION

A preferred embodiment of the present invention is directed to a high-frequency signal line including a first base layer having flexibility, a linear signal line provided on the first base layer and including a first line portion having a first width and a second line portion having a second width greater than the first width, and a first reinforcing conductor provided on the first base layer along the first line portion.

Another preferred embodiment of the present invention is directed to a high-frequency signal line including a first base layer having flexibility, a linear signal line provided on the first base layer and including a first line portion having a first width and a second line portion having a second width greater than the first width, and a first reinforcing conductor having a linear shape on the first base layer along the signal line and including first and second reinforcing portions, the first and reinforcing portion extending along the first line portion and having a third width, the second reinforcing portion extending along the second line portion and having a fourth width less than the third width.

Still another preferred embodiment of the present invention is directed to a method for producing a base layer with a signal line, the base layer including a first mother base layer having flexibility, the signal line formed to have a linear shape on the first mother base layer and including a first line portion having a first width and a second line portion having a second width greater than the first width, and a first reinforcing conductor provided on the first mother base layer along the first line portion. The method includes forming the signal line and the first reinforcing conductor on the first mother base layer fed from a first roller to be wound up on a second roller by patterning a conductor film formed on the first mother base layer being transferred between the first roller and the second roller.

Yet another preferred embodiment of the present invention is directed to a method for producing a base layer with a signal line, the base layer including a first mother base layer having flexibility, the signal line formed to have a linear shape on the first mother base layer and including a first line portion having a first width and a second line portion having a second width greater than the first width, and a first reinforcing conductor formed in a linear shape on the first mother base layer along the signal line and including first and second reinforcing portions, the first reinforcing portion extending along the first line portion and having a third width, the second reinforcing portion extending along the second line portion and having a fourth width less than the third width. The method includes forming the signal line and the first reinforcing conductor on the first mother base layer fed from a first roller to be wound up on a second roller by patterning a conductor film formed on the first mother base layer being transferred between the first roller and the second roller.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram describing the steps of forming a signal line and reinforcing conductors on the mother sheet.

FIG. 8 is a diagram describing the process of pressure bonding of mother sheets.

DETAILED DESCRIPTION OF THE PREFERRED EMBODIMENTS

Hereinafter, high-frequency signal lines according to various preferred embodiments of the present invention, along with a method for producing a base layer with a signal line, will be described with reference to the drawings.

Figure 1A:
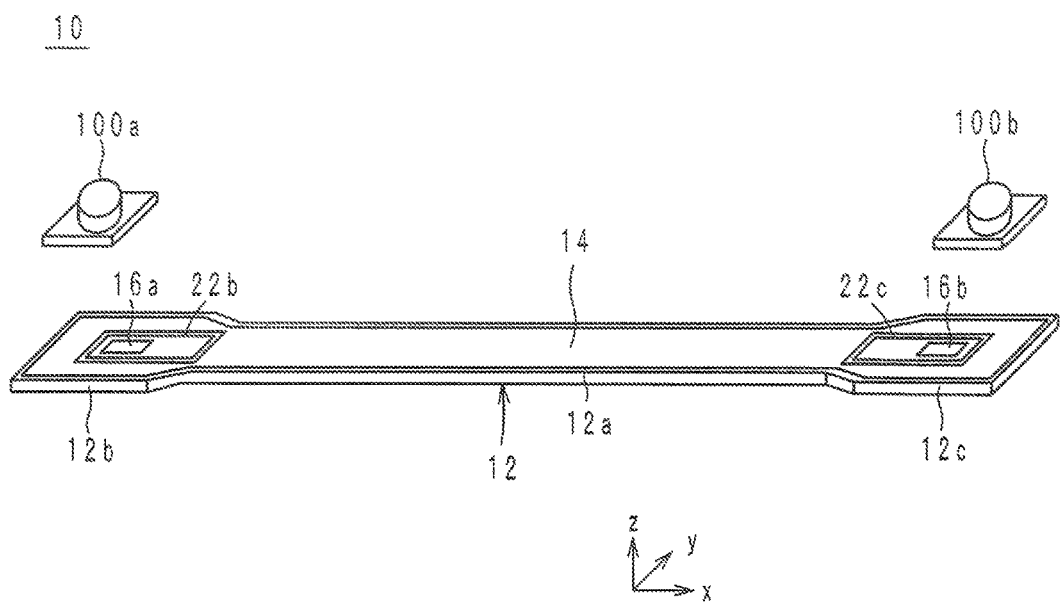
FIGS. 1A and 1B are an external oblique view of a high-frequency signal line according to a preferred embodiment of the present invention.
Figure 1B:
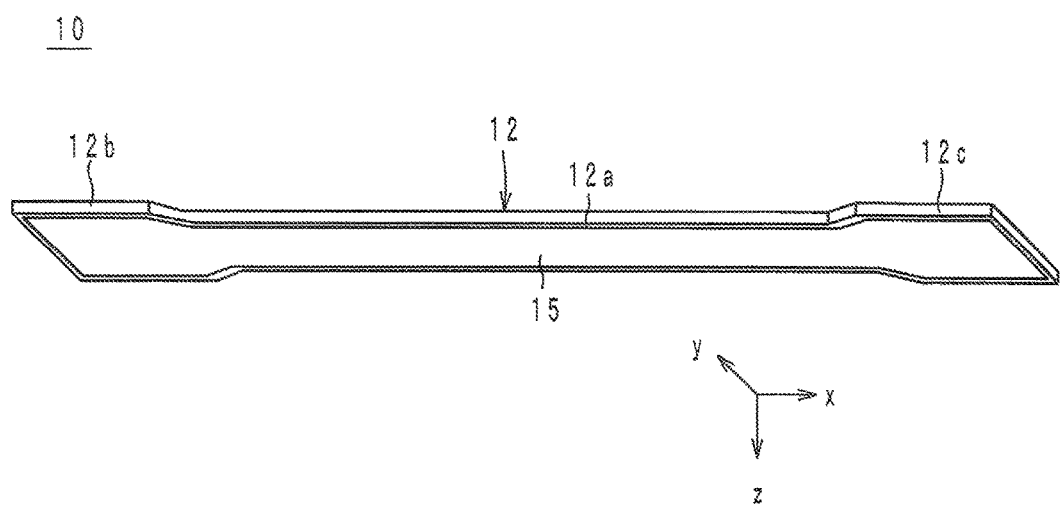
Figure 2:
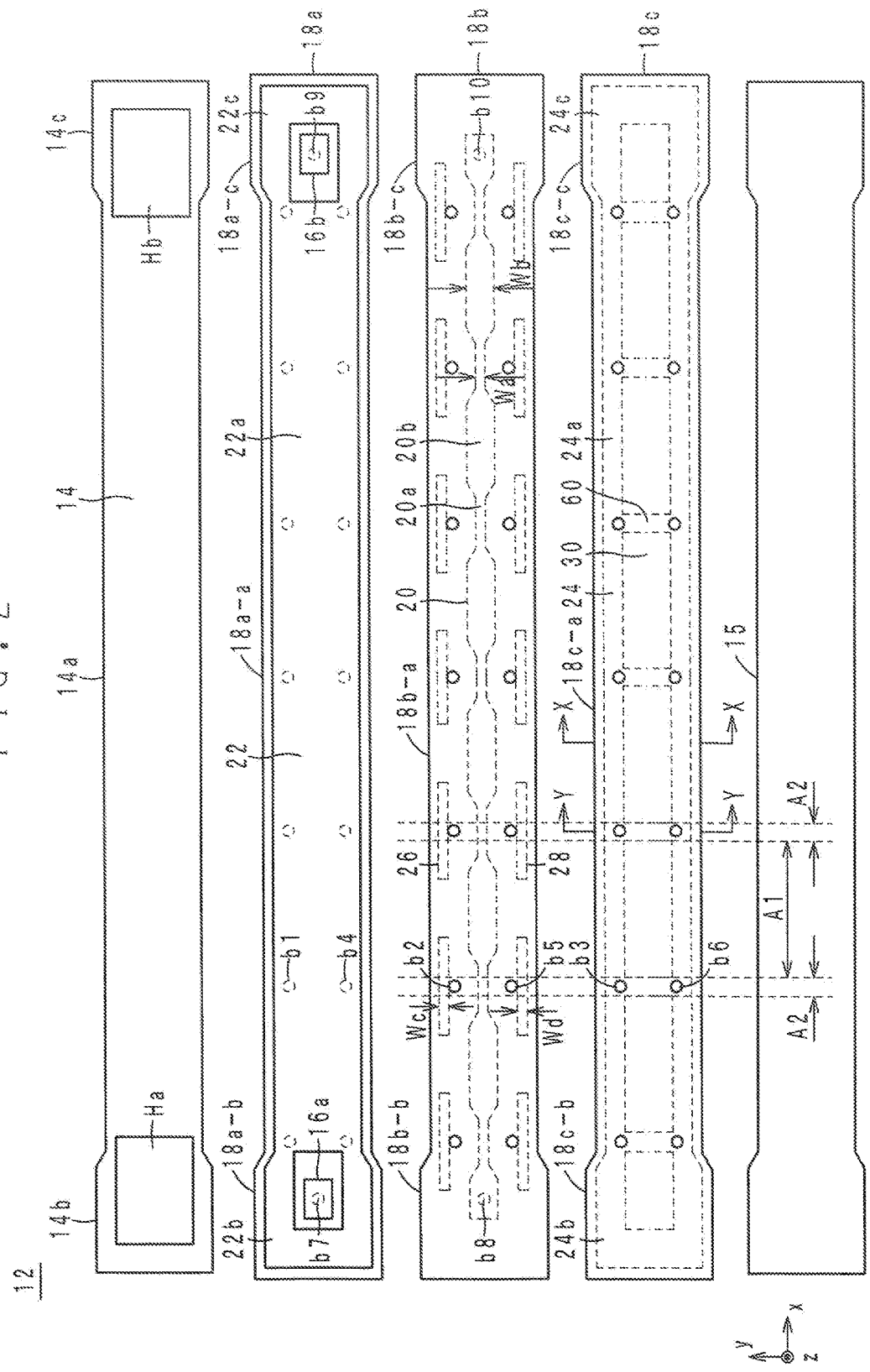
FIG. 2 is an exploded view of the high-frequency signal line according to a preferred embodiment of the present invention.
Figure 3A:
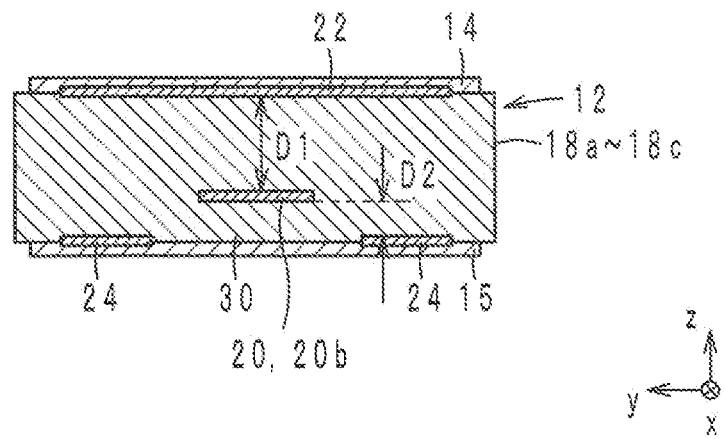
FIG. 3A is a cross-sectional structure view of the high-frequency signal line taken along line X-X of FIG. 2.
Figure 3B:
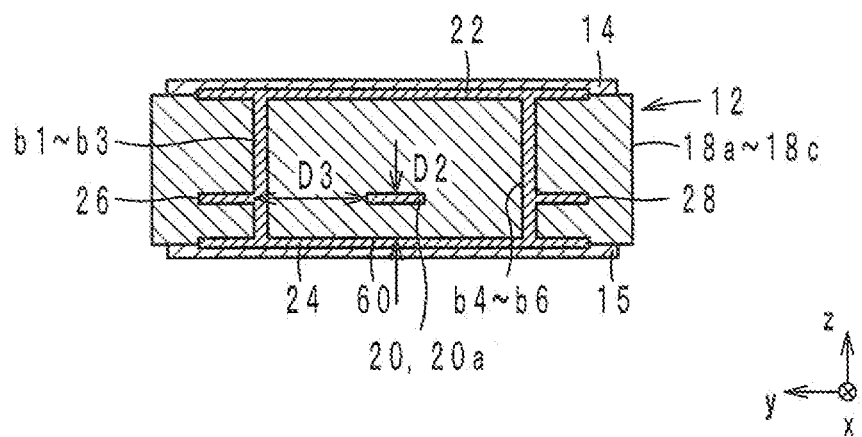
FIG. 3B is a cross-sectional structure view of the high-frequency signal line taken along line Y-Y of FIG. 2.

The configuration of a high-frequency signal line according to a preferred embodiment will be described below. FIGS. 1A and 1B are external oblique views of the high-frequency signal line 10 according to the present preferred embodiment. FIG. 2 is an exploded view of the high-frequency signal line 10 according to the present preferred embodiment. FIG. 3A is a cross-sectional structure view of the high-frequency signal line 10 taken along line X-X of FIG. 2. FIG. 3B is a cross-sectional structure view of the high-frequency signal line 10 taken along line Y-Y of FIG. 2. In FIGS. 1 through 3B, the direction of lamination of the high-frequency signal line 10 will be defined as a z-axis direction. In addition, the longitudinal direction of the high-frequency signal line 10 will be defined as an x-axis direction, and the direction perpendicular to the x-axis and z-axis directions will be defined as a y-axis direction.

The high-frequency signal line 10 includes a laminate 12, protective layers 14 and 15, external terminals 16a and 16b, a signal line 20, ground conductors 22 and 24, reinforcing conductors 26 and 28, connectors 100a and 100b, and via-hole conductors b1 to b10, as shown in FIGS. 1 and 2.

The laminate 12 extends in the x-axis direction when viewed in a plan view in the z-axis direction, and includes a line portion 12a and connecting portions 12b and 12c. The laminate 12 is a flexible laminate including dielectric sheets (base layers) (18a to 18c) laminated in this order from the positive side to the negative side in the z-axis direction, as shown in FIG. 2. That is, the dielectric sheet 18a is positioned on the other side from the dielectric sheet 18c with the dielectric sheet 18b positioned therebetween. In the following, the principal surface of the laminate 12 that is located on the positive side in the z-axis direction will be referred to as a top surface, and the principal surface of the laminate 12 that is located on the negative side in the z-axis direction will be referred to as a bottom surface.

The line portion 12a extends in the x-axis direction. The connecting portion 12b is preferably in the form of a rectangle connected to the end of the line portion 12a on the negative side in the x-axis direction. The connecting portion 12c preferably is in the form of a rectangle connected to the end of the line portion 12a on the positive side in the x-axis direction. The width of each of the connecting portions 12b and 12c in the y-axis direction is equal or substantially equal to the width of the line portion 12a in the y-axis direction.

The dielectric sheets 18a to 18c, when viewed in a plan view in the z-axis direction, extend in the x-axis direction and have the same shape as the laminate 12. The dielectric sheets 18a to 18c are preferably made of a flexible thermoplastic resin such as polyimide or liquid crystal polymer. The thickness of the dielectric sheet 18a after the lamination preferably is, for example, about 100 μm. The thickness of the dielectric sheet 18b after the lamination preferably is, for example, about 50 μm. The thickness of the dielectric sheet 18c after the lamination preferably is, for example, about 50 μm. In the following, the principal surfaces of the dielectric sheets 18a to 18c that are located on the positive side in the z-axis direction will be referred to as top surfaces, and the principal surfaces of the dielectric sheets 18a to 18c that are located on the negative side in the z-axis direction will be referred to as bottom surfaces.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The signal line 20 is a linear conductor provided on the bottom surface of the dielectric sheet 18b and extending in the x-axis direction, as shown in FIGS. 2, 3A, and 3B. The signal line 20 is preferably formed by patterning metal foil, which is made of a metal material including silver or copper and having a low specific resistance, into a predetermined shape. Note that the metal foil is firmly fixed to the bottom surface of the dielectric sheet 18b using the anchor effect or an adhesive layer.

The signal line 20 includes line portions 20a and 20b. The line portion 20a has a width Wa. The line portion 20b has a width Wb. The width Wb is greater than the width Wa. The line portions 20a and 20b are arranged so as to alternate in the x-axis direction. The line portion 20b is tapered at opposite ends. Accordingly, the line portion 20b is narrowed near the ends toward the line portions 20a.

The ground conductor 22 (second ground conductor) is provided in the laminate 12, more precisely, on the top surface of the dielectric sheet 18a, as shown in FIGS. 2, 3A, and 3B. The ground conductor 22 is opposite to the signal line 20 with the dielectric sheets 18a and 18b positioned therebetween. The ground conductor 22 extends in the x-axis direction when viewed in a plan view in the z-axis direction, and is preferably formed by patterning metal foil, which is made of a metal material including silver or copper and having a low specific resistance, into a predetermined shape. Note that the metal foil is firmly fixed to the top surface of the dielectric sheet 18a using the anchor effect or an adhesive layer.

Furthermore, the ground conductor 22 includes a line portion 22a and terminal portions 22b and 22c, as shown in FIG. 2. The line portion 22a is provided on the top surface of the line portion 18a-a and preferably has an elongated rectangular or substantially rectangular shape extending in the x-axis direction. Accordingly, the line portion 22a overlaps with the signal line 20 when viewed in a plan view in the z-axis direction. The line portion 22a is a solid conductor having no openings or the like provided therein.

The terminal portion 22b preferably has a rectangular or substantially rectangular frame shape on the top surface of the connecting portion 18a-b, as shown in FIG. 2. The terminal portion 22b is connected to the end of the line portion 22a on the negative side in the x-axis direction. The terminal portion 22c preferably has a rectangular or substantially rectangular frame shape on the top surface of the connecting portion 18a-c. The terminal portion 22c is connected to the end of the line portion 22a on the positive side in the x-axis direction.

The ground conductor 24 (first ground conductor) is provided in the laminate 12, more precisely, on the bottom surface of the dielectric sheet 18c, as shown in FIGS. 2, 3A, and 3B. Accordingly, the ground conductor 24 is positioned on the other side from the ground conductor 22 with the signal line 20 positioned therebetween. The ground conductor 24 is opposite to the signal line 20 with the dielectric sheet 18c positioned therebetween. The ground conductor 24 extends in the x-axis direction when viewed in a plan view in the z-axis direction, and is preferably formed by patterning metal foil, which is made of a metal material including silver or copper and having a low specific resistance, into a predetermined shape. Note that the metal foil is firmly fixed to the bottom surface of the dielectric sheet 18c using the anchor effect or an adhesive layer.

Furthermore, the ground conductor 24 includes a line portion 24a and terminal portions 24b and 24c, as shown in FIG. 2. The line portion 24a is provided on the bottom surface of the line portion 18c-a and preferably has an elongated rectangular or substantially rectangular shape extending in the x-axis direction.

Furthermore, the line portion 24a includes a plurality of openings 30 arranged in the x-axis direction. Accordingly, the line portion 24a preferably has a ladder-shaped configuration. Moreover, portions of the line portion 24a that are positioned between the openings 30 will be referred to as bridge portions 60. The openings 30 are preferably in the form of rectangles overlapping with the line portions 20b when viewed in a plan view in the z-axis direction, as shown in FIGS. 2, 3A, and 3B. In addition, the openings 30 also overlap with the line portions 20a to some extent. The bridge portions 60 overlap with the line portions 20a when viewed in a plan view in the z-axis direction, as shown in FIGS. 2, 3A, and 3B.

The terminal portion 24b is provided preferably in the form of a rectangular or substantially rectangular frame on the bottom surface of the connecting portion 18c-b, as shown in FIG. 2. The terminal portion 24b is connected to the end of the line portion 24a on the negative side in the x-axis direction. The terminal portion 24c is provided preferably in the form of a rectangular or substantially rectangular frame on the bottom surface of the connecting portion 18c-c. The terminal portion 24c is connected to the end of the line portion 24a on the positive side in the x-axis direction.

Furthermore, the distance D1 between the signal line 20 and the ground conductor 22 in the z-axis direction is greater than the distance D2 between the signal line 20 and the ground conductor 24 in the z-axis direction, as shown in FIGS. 3A and 3B. The distance D1 is equal or approximately equal to the total thickness of the dielectric sheets 18a and 18b, and the distance D2 is equal or approximately equal to the thickness of the dielectric sheet 18c. That is, the signal line 20 is positioned closer to the ground conductor 24 with the openings 30 than to the ground conductor 22, which is preferably in the form of a solid without openings.

The reinforcing conductors 26 are linear conductors provided on the bottom surface of the dielectric sheet 18b and extending in the x-axis direction, as shown in FIGS. 2, 3A, and 3B. More specifically, the reinforcing conductors 26 are positioned on the positive side in the y-axis direction relative to the line portions 20a so as to extend in the x-axis direction along the line portions 20a. The reinforcing conductors 26, when viewed in a plan view in the y-axis direction, do not overlap with the line portions 20b entirely but only to some extent. The reinforcing conductors 26 have a width Wc. The reinforcing conductors 26 are preferably made of a metal material including silver or copper and having a low specific resistance.

The reinforcing conductors 28 are linear conductors provided on the bottom surface of the dielectric sheet 18b and extending in the x-axis direction, as shown in FIGS. 2, 3A, and 3B. More specifically, the reinforcing conductors 28 are positioned on the negative side in the y-axis direction relative to the line portions 20a so as to extend in the x-axis direction along the line portions 20a. Accordingly, the reinforcing conductors 28 are positioned on the other side of the signal line 20 from the reinforcing conductors 26. The reinforcing conductors 28, when viewed in a plan view in the y-axis direction, do not overlap with the line portions 20b entirely but only to some extent. The reinforcing conductors 28 have a width Wd equal or approximately equal to the width Wc. The reinforcing conductors 28 are preferably made of a metal material including silver or copper and having a low specific resistance.

Here, the total of the width Wa of the line portion 20a, the width Wc of the reinforcing conductor 26, and the width Wd of the reinforcing conductor 28 is equal or approximately equal to the width Wb of the line portion 20b, as shown in FIG. 2. Moreover, the shortest distance D3 between the line portion 20a and the reinforcing conductor 26 or 28 is greater than the shortest distance D2 between the line portion 20a and the bridge portion 60 of the ground conductor 24, as shown in FIGS. 3A and 3B.

The external terminal 16a is a rectangular or substantially rectangular conductor provided at the center on the top surface of the connecting portion 18a-b. Accordingly, the external terminal 16a is surrounded by the terminal portion 22b. The external terminal 16a, when viewed in a plan view in the z-axis direction, overlaps with the end of the signal line 20 on the negative side in the x-axis direction. The external terminal 16a is preferably made of a metal material including silver or copper and having a low specific resistance. In addition, the top surface of the external terminal 16a is plated with gold.

The external terminal 16b is a rectangular or substantially rectangular conductor provided at the center on the top surface of the connecting portion 18a-c. Accordingly, the external terminal 16b is surrounded by the terminal portion 22c. The external terminal 16b, when viewed in a plan view in the z-axis direction, overlaps with the end of the signal line 20 on the positive side in the x-axis direction. The external terminal 16b is preferably made of a metal material including silver or copper and having a low specific resistance. In addition, the top surface of the external terminal 16b is plated with gold.

The via-hole conductors b1 pierce through the line portion 18a-a of the dielectric sheet 18a in the z-axis direction, and when viewed in a plan view in the z-axis direction, the via-hole conductors b1 are arranged in a line in the x-axis direction on the positive side in the y-axis direction relative to the signal line 20. The via-hole conductors b2 pierce through the line portion 18b-a of the dielectric sheet 18b in the z-axis direction, and when viewed in a plan view in the z-axis direction, the via-hole conductors b2 are arranged in a line in the x-axis direction on the positive side in the y-axis direction relative to the signal line 20. The via-hole conductors b3 pierce through the line portion 18c-a of the dielectric sheet 18c in the z-axis direction, and when viewed in a plan view in the z-axis direction, the via-hole conductors b3 are arranged in a line in the x-axis direction on the positive side in the y-axis direction relative to the signal line 20. The via-hole conductors b1 to b3 are connected to one another, such that each set constitutes a single via-hole conductor. The via-hole conductors b1 to b3, when viewed in a plan view in the z-axis direction, are positioned near the end of the bridge portion 60 on the positive side in the y-axis direction. The end of the via-hole conductor b1 that is located on the positive side in the z-axis direction is connected to the ground conductor 22. The end of the via-hole conductor b3 that is located on the negative side in the z-axis direction is connected to the ground conductor 24. Moreover, both the via-hole conductors b1 and b2 are connected to the reinforcing conductor 26.

The via-hole conductors b4 pierce through the line portion 18a-a of the dielectric sheet 18a in the z-axis direction, and when viewed in a plan view in the z-axis direction, the via-hole conductors b4 are arranged in a line in the x-axis direction on the negative side in the y-axis direction relative to the signal line 20. The via-hole conductors b5 pierce through the line portion 18b-a of the dielectric sheet 18b in the z-axis direction, and when viewed in a plan view in the z-axis direction, the via-hole conductors b5 are arranged in a line in the x-axis direction on the negative side in the y-axis direction relative to the signal line 20. The via-hole conductors b6 pierce through the line portion 18c-a of the dielectric sheet 18c in the z-axis direction, and when viewed in a plan view in the z-axis direction, the via-hole conductors b6 are arranged in a line in the x-axis direction on the negative side in the y-axis direction relative to the signal line 20. The via-hole conductors b4 to b6 are connected to one another, such that each set constitutes a single via-hole conductor. The via-hole conductors b4 to b6, when viewed in a plan view in the z-axis direction, are positioned near the end of the bridge portion 60 on the negative side in the y-axis direction. The end of the via-hole conductor b4 that is located on the positive side in the z-axis direction is connected to the ground conductor 22. The end of the via-hole conductor b6 that is located on the negative side in the z-axis direction is connected to the ground conductor 24. Moreover, both the via-hole conductors b4 and b5 are connected to the reinforcing conductor 28.

The via-hole conductor b7 pierces through the connecting portion 18a-b of the dielectric sheet 18a in the z-axis direction. The via-hole conductor b8 pierces through the connecting portion 18b-b of the dielectric sheet 18b in the z-axis direction. The via-hole conductors b7 and b8 are connected to each another so as to constitute a single via-hole conductor. The end of the via-hole conductor b7 that is located on the positive side in the z-axis direction is connected to the external terminal 16a, and the end of the via-hole conductor b8 that is located on the negative side in the z-axis direction is connected to the end of the signal line 20 that is located on the negative side in the x-axis direction.

The via-hole conductor b9 pierces through the connecting portion 18a-c of the dielectric sheet 18a in the z-axis direction. The via-hole conductor b10 pierces through the connecting portion 18b-c of the dielectric sheet 18b in the z-axis direction. The via-hole conductors b9 and b10 are connected to each another so as to constitute a single via-hole conductor. The end of the via-hole conductor b9 that is located on the positive side in the z-axis direction is connected to the external terminal 16b, and the end of the via-hole conductor b10 that is located on the negative side in the z-axis direction is connected to the end of the signal line 20 that is located on the positive side in the x-axis direction.

The via-hole conductors b1 to b10 are preferably made of a metal material including silver or copper and having a low specific resistance. Note that instead of using the via-hole conductors b1 to b10, through-holes with conductive layers formed, for example, by plating on their inner circumferential surfaces may be used.

The protective layer 14 covers approximately the entire top surface of the dielectric sheet 18a. Accordingly, the ground conductor 22 is covered by the protective layer 14. The protective layer 14 is preferably made of, for example, a flexible resin such as a resist material.

Furthermore, the protective layer 14 includes a line portion 14a and connecting portions 14b and 14c, as shown in FIG. 2. The line portion 14a covers approximately the entire top surface of the line portion 18a-a, including the line portion 22a.

The connecting portion 14b is connected to the end of the line portion 14a on the negative side in the x-axis direction, and covers the top surface of the connecting portion 18b. However, the connecting portion 14b includes an opening Ha provided therein. The opening Ha is a rectangular or substantially rectangular opening provided in the connecting portion 14b. The external terminal 16a and the terminal portion 22b are exposed to the outside from the opening Ha. The terminal portion 22b defines and functions as an external terminal because it is exposed to the outside from the opening Ha.

The connecting portion 14c is connected to the end of the line portion 14a on the positive side in the x-axis direction, and covers the top surface of the connecting portion 18a-c. The connecting portion 14c has an opening Hb provided therein. The opening Hb is a rectangular or substantially rectangular opening provided in the connecting portion 14c. The external terminal 16b and the terminal portion 22c are exposed to the outside from the opening Hb. The terminal portion 22c defines and functions as an external terminal because it is exposed to the outside from the opening Hb.

The protective layer 15 covers approximately the entire bottom surface of the dielectric sheet 18c. Accordingly, the ground conductor 24 is covered by the protective layer 15. The protective layer 15 is preferably made of, for example, a flexible resin such as a resist material.

Figure 4A:
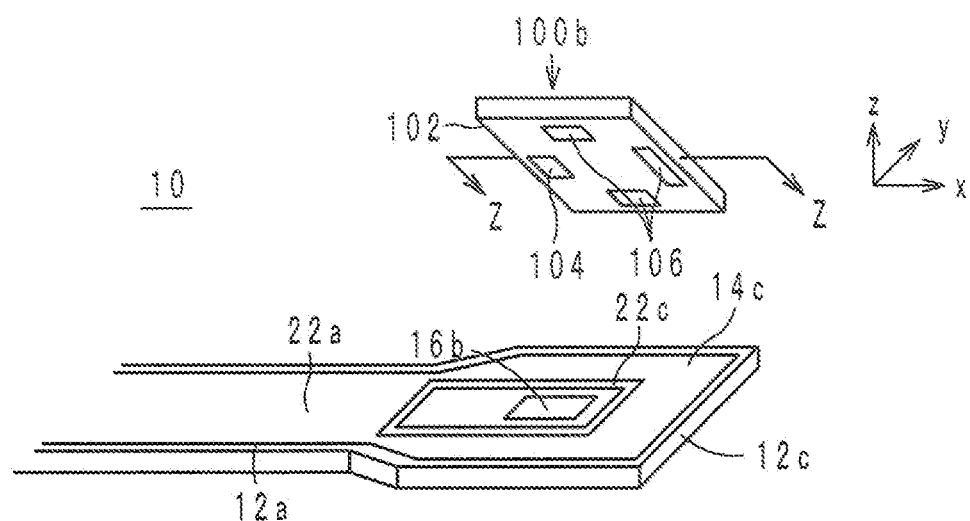
FIG. 4A is an external oblique view of a connector of the high-frequency signal line.

The connectors 100a and 100b are mounted on the top surfaces of the connecting portions 12b and 12c, respectively, so as to be electrically connected to the signal line 20 and the ground conductors 22 and 24. The connectors 100a and 100b have the same configuration, and therefore, only the configuration of the connector 100b will be described below as an example. FIG. 4A is an external oblique view of the connector 100b of the high-frequency signal line 10.

Figure 4B:
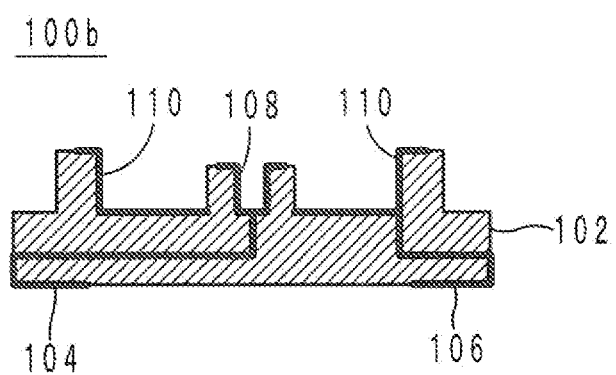
FIG. 4B is a cross-sectional structure view of the connector of the high-frequency signal line taken along line Z-Z of FIG. 4A.

FIG. 4B is a cross-sectional structure view of the connector 100b taken along line Z-Z of FIG. 4A.

The connector 100b includes a connector body 102, external terminals 104 and 106, a center conductor 108, and an external conductor 110, as shown in FIGS. 1, 4A, and 4B. The connector body 102 includes a rectangular or substantially rectangular plate and a cylindrical or substantially cylindrical portion coupled thereon, and is preferably made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the terminal portion 22c exposed from the opening Hb.

The center conductor 108 is positioned at the center of the cylindrical portion of the connector body 102, and is connected to the external terminal 104. The center conductor 108 is a signal terminal to/from which a high-frequency signal that is to be or has been transmitted through the signal line 20 is inputted/outputted.

The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c. As a result, the signal conductor 20 is electrically connected to the center conductor 108. In addition, the ground conductors 22 and 24 are electrically connected to the external conductor 110.

Figure 5A:
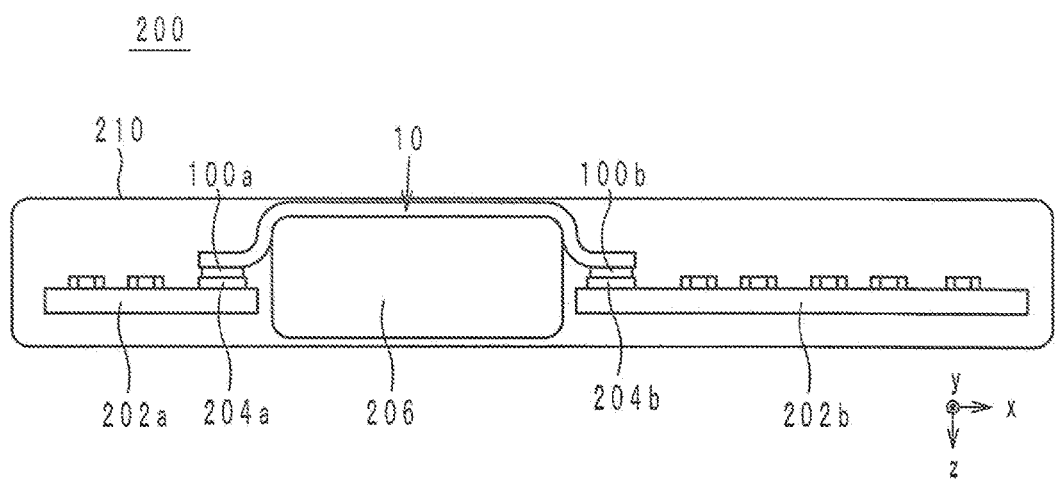
FIG. 5A illustrates an electronic device provided with the high-frequency signal line as viewed in a plan view in the y-axis direction.
Figure 5B:
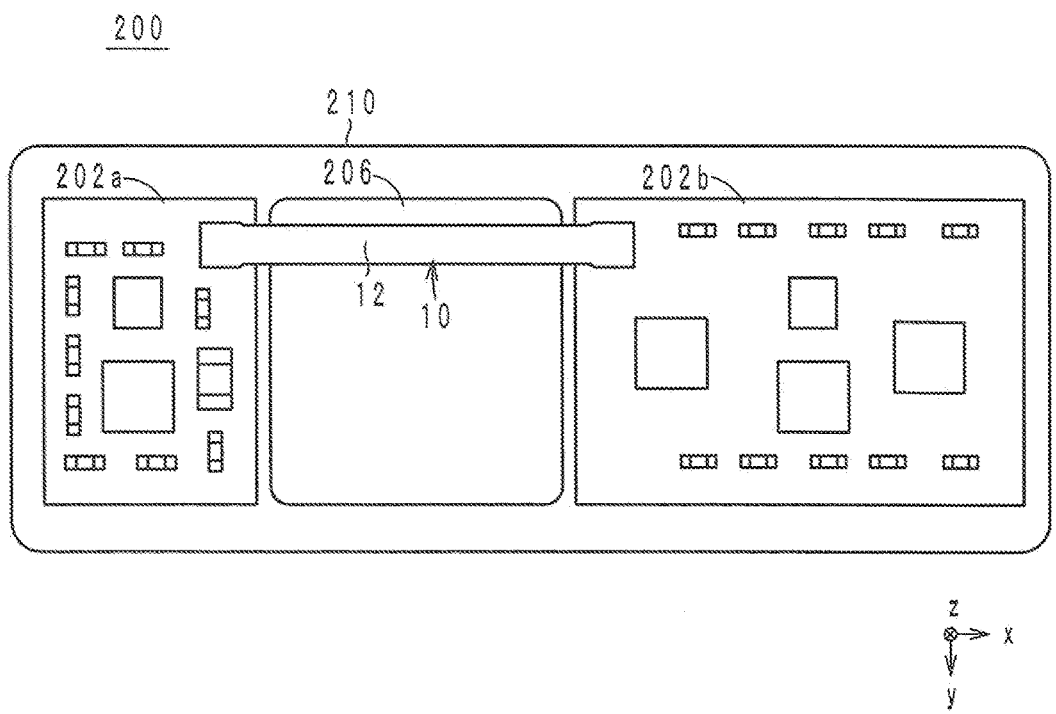
FIG. 5B illustrates the electronic device provided with the high-frequency signal line as viewed in a plan view in the z-axis direction.

The high-frequency signal line 10 is preferably used in a manner as will be described below. FIG. 5A illustrates an electronic device 200 provided with the high-frequency signal line 10 as viewed in a plan view in the y-axis direction. FIG. 5B illustrates the electronic device 200 provided with the high-frequency signal line 10 as viewed in a plan view in the z-axis direction.

The electronic device 200 preferably is a communication terminal device including the high-frequency signal line 10, circuit boards 202a and 202b, receptacles 204a and 204b, a battery pack (metallic body) 206, and a housing 210. The high-frequency signal line 10 is preferably used to connect an antenna element and a feed circuit provided in the communication terminal device.

The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The top surface of the high-frequency signal line 10 (more precisely, the protective layer 14) is in contact with the battery pack 206. The top surface of the high-frequency signal line 10 and the battery pack 206 are fixed by an adhesive or other suitable material or device.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, from about 0.5 GHz to about 3.0 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal line 10 connects the circuit boards 202a and 202b.

Here, there is a difference in level between each of the receptacles 204a and 204b and the principal surface of the battery pack 206 that is located on the negative side in the z-axis direction. Accordingly, the connectors 100a and 100b are connected to the receptacles 204a and 204b, respectively, by curving the laminate 12 at both ends of the line portion 12a.

Figure 6:
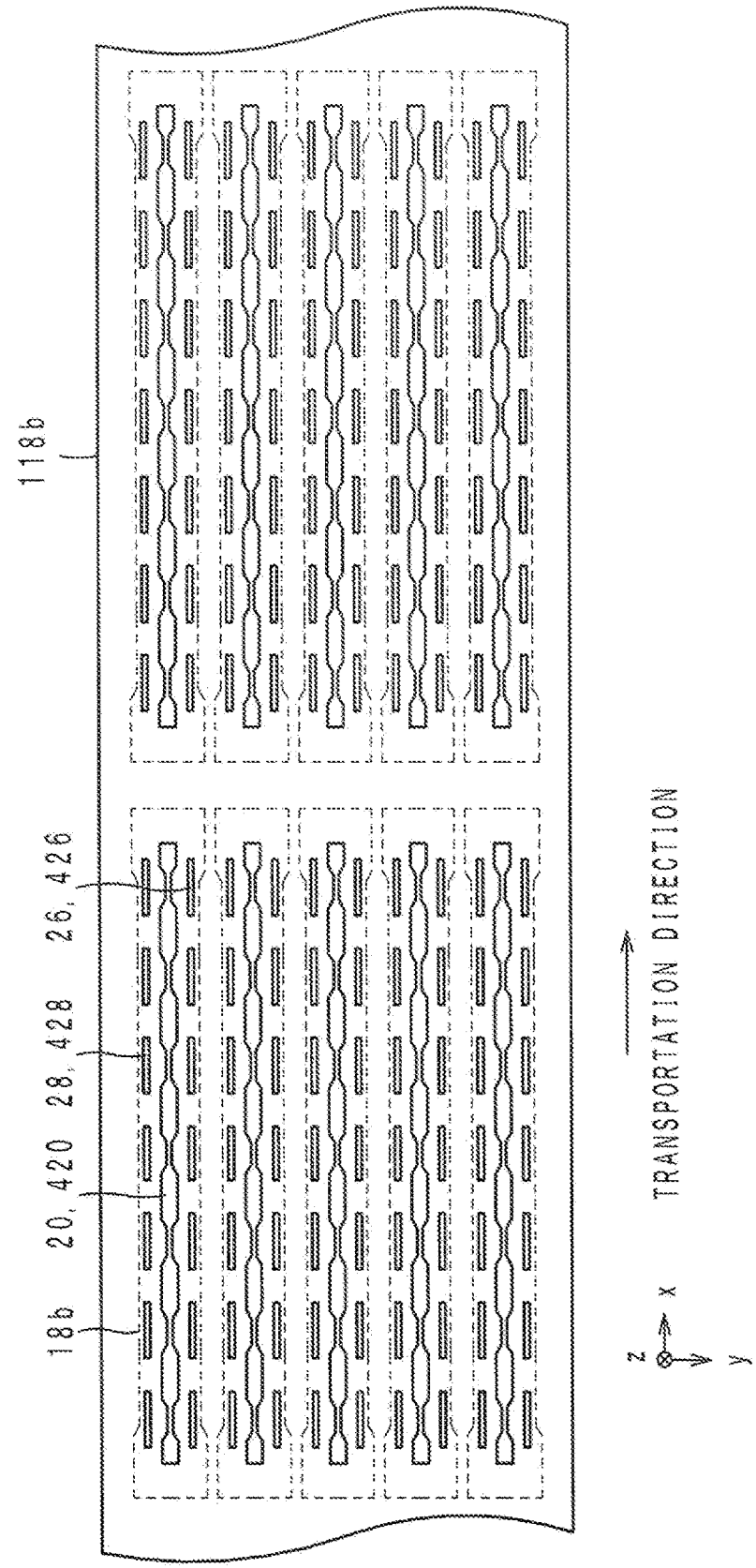
FIG. 6 is a diagram illustrating a mother sheet.

A non-limiting example of the method for producing the high-frequency signal line 10, including the process of producing a mother sheet 118b with a signal line 20, will be described below with reference to FIGS. 2, 6, 7, and 8. FIG. 6 is a plan view of the mother sheet 118b as seen from the negative side in the z-axis direction. FIG. 7 is a diagram describing the steps of forming the signal line 20 and reinforcing conductors 26 and 28 on the mother sheet 118b. FIG. 8 is a diagram describing the process of pressure bonding of mother sheets 118a to 118c.

Prepared first are mother sheets 118a to 118c made of a thermoplastic resin and copper-foiled entirely on their top surfaces. The mother sheets 118a to 118c are large-sized sheets to be cut into dielectric sheets 18a to 18c. The copper-foiled top surfaces of the mother sheets 118a to 118c are smoothened, for example, by galvanization for rust prevention. The thickness of the copper foil preferably is from about 10 μm to about 20 μm, for example.

Next, a signal line 20 and reinforcing conductors 26 and 28, as shown in FIG. 2 are formed on the bottom surface of the mother sheet 118b by photolithography, as will be described below.

Initially, a resist pattern is formed on the mother sheet 118b. The mother sheet 118b is in the form of a roll wound around a supply roller 300, as shown in FIG. 7. The mother sheet 118b is fed from the supply roller 300 to be wound up on a take-up roller 302. A transportation roller 304, a printing device 308, and a transportation roller 306 are arranged in this order between the supply roller 300 and the take-up roller 302. The transportation rollers 304 and 306 transfer the mother sheet 118b. The printing device 308 prints resists 420, 426, and 428 on the copper foil of the mother sheet 118b in the same shapes as the signal line 20 and the reinforcing conductors 26 and 28, as shown in FIG. 6. The resists 420, 426, and 428 are formed in a plurality of sets so as to be arranged in a matrix. Moreover, the resists 420 extend in the direction in which the mother sheet 118b is transported. Accordingly, the mother sheet 118b with the resists 420, 426, and 428 printed thereon is wound up into a roll around the take-up roller 302.

Next, the copper foil of the mother sheet 118b is etched. The mother sheet 118b wound on the take-up roller 302 is used as a supply roller 310, as shown in FIG. 7. While the mother sheet 118b coated with copper foil (conductor film) is being fed from the supply roller 310 to be wound up on a take-up roller 312, the copper foil is patterned between the supply roller 310 and the take-up roller 312, such that the signal line 20 and the reinforcing conductors 26 and 28 are formed on the mother sheet 118b, as shown in FIG. 6. More specifically, the mother sheet 118b is wound up on the take-up roller 312 while it is being fed from the supply roller 310. A transportation roller 314, an etching device 317, and a transportation roller 316 are arranged in this order between the supply roller 310 and the take-up roller 312. The transportation rollers 314 and 316 transfer the mother sheet 118b. The etching device 317 sprays an etchant onto the copper foil, thereby removing the portions of the copper foil that are not covered by the resists 420, 426, and 428, and thereafter, the resists 420, 426, and 428 are removed by a spray of resist remover. As a result, the signal line 20 and the reinforcing conductors 26 and 28 are formed and arranged in a matrix on the bottom surface of the mother sheet 118b, as shown in FIG. 6. The signal line 20 extends in the direction in which the mother sheet 118b is transported. The mother sheet 118b with the signal line 20 and the reinforcing conductors 26 and 28 printed thereon is wound into a roll around the take-up roller 312.

Next, external terminals 16a and 16b and a ground conductor 22, as shown in FIG. 2, are formed on the top surface of the mother sheet 118a by photolithography. The steps of forming the external terminals 16a and 16b are essentially the same as the steps of forming the signal line 20 and the reinforcing conductors 26 and 28, and therefore, any descriptions thereof will be omitted.

Next, a ground conductor 24, as shown in FIG. 2, is formed on the bottom surface of the mother sheet 118c by photolithography. The step of forming the ground conductor 24 is essentially the same as the steps of forming the signal line 20 and the reinforcing conductors 26 and 28, and therefore, any descriptions thereof will be omitted.

Next, while the mother sheets 118a to 118c wound on the take-up roller 312 are being fed, through-holes are provided in the mother sheets 118a to 118c by laser beam irradiation on their bottom surfaces where via-hole conductors b1 to b10 are to be formed. Note that the through-holes may be formed by punching. In addition, the through-holes provided in the mother sheets 118a to 118c are filled with a conductive paste obtained by dispersing copper powder in a solvent containing a binder. Thereafter, the mother sheets 118a to 118c are wound up on the take-up rollers 319, 320, and 322, respectively.

Next, the mother sheets 118a to 118c are fed from the take-up rollers 319, 320, and 322, and stacked in this order, as shown in FIG. 8, and further, the mother sheets 118a to 118c are bonded by pressure rollers 324. At this time, the pressure rollers 324 also heat the mother sheets 118a to 118c. As a result, the mother sheets 118a to 118c are softened to be bonded and integrated together, and further, the conductive paste filling the through-holes is solidified, so that via-hole conductors b1 to b10, as shown in FIG. 2, are formed.

Next, a resin (resist) paste is applied to both the top surface of the mother sheet 118a and the bottom surface of the mother sheet 118b, thus forming protective layers 14 and 15 on the respective faces. In addition, connectors 100a and 100b are mounted on the top surface of the mother sheet 118a.

Lastly, the mother sheets 118a to 118c are punched out into a predetermined shape, thus obtaining a high-frequency signal line 10.

The high-frequency signal line 10 thus configured renders it possible to significantly reduce or prevent the occurrence of breakage in the signal line 20. More specifically, in the case where the signal line 20 extends parallel or substantially parallel to the transportation direction of the mother sheet 118b, the mother sheet 118b and the signal line 20 are pulled in directions in which the signal line 20 can be stretched. The mother sheet 118b is thin and flexible and therefore can be stretched more readily than the signal line 20, which is made of metal foil. Accordingly, tensile stress is concentrated on the signal line 20. Moreover, the signal line 20 includes the line portion 20a having the width Wa and the line portion 20b having the width Wb greater than the width Wa. Therefore, in an attempt to form the signal line 20 by patterning the mother sheet 118b being fed from the supply roller 310 to be wound up on the take-up roller 312, the line portion 20a having the narrower width Wa might be broken because of tensile stress.

Therefore, the high-frequency signal line 10 includes the reinforcing conductors 26 and 28 provided on the dielectric sheet 18b along the line portion 20a. The reinforcing conductors 26 and 28 are formed at the same time as the signal line 20. Accordingly, the tensile stress applied during the winding of the mother sheet 118a is dispersed to the line portion 20a and the reinforcing conductors 26 and 28. Thus, the line portion 20a is prevented from being stretched by tensile stress, resulting in prevention of breakage in the line portion 20a.

Furthermore, in the high-frequency signal line 10, the total of the width Wa of the line portion 20a, the width We of the reinforcing conductor 26, and the width Wd of the reinforcing conductor 28 is equal or approximately equal to the width Wb of the line portion 20b. Accordingly, the total strength of the line portion 20a and the reinforcing conductors 26 and 28 is close to the strength of the line portion 20b. Therefore, the tensile strength in the x-axis direction is uniform or approximately uniform across the entire mother sheet 118b. Thus, the signal line 20 is prevented from being broken by stress concentrating on a portion of the signal line 20 while the mother sheet 118b is being wound.

Furthermore, the high-frequency signal line 10 renders it possible to significantly reduce or prevent low-frequency noise generation. More specifically, in the high-frequency signal line 10, the ground conductor 24 does not overlap with the signal line 20 except at the bridge portions 60 because of the openings 30. In the following, areas of the high-frequency signal line 10 where the signal line 20 overlaps with the openings 30 will be referred to as areas A1, and areas where the signal line 20 overlaps with the bridge portions 60 will be referred to as areas A2.

The capacitance generated between the signal line 20 and the ground conductor 24 is lower in the area A1 than in the area A2. Accordingly, the characteristic impedance Z1 of the signal line 20 in the area A1 is higher than the characteristic impedance Z2 of the signal line 20 in the area A2. Therefore, the signal line 20 switches cyclically between the characteristic impedance Z1 and the characteristic impedance Z2. As a result, in the signal line 20, a standing wave with a short wavelength (i.e., a high frequency) is generated between the bridge portions 60. On the other hand, a standing wave with a long wavelength (i.e., a low frequency) is less likely to be generated between the external terminals 16a and 16b. Thus, the high-frequency signal line 10 renders it possible to significantly reduce or prevent low-frequency noise generation.

Note that in the high-frequency signal line 10, higher-frequency noise occurs because of the standing wave generated between the bridge portions 60. Accordingly, the distance between the bridge portions 60 is designed to be sufficiently short to keep the frequency of such noise outside the frequency band of high-frequency signals to be transmitted through the signal line 20. To this end, the bridge portions 60 are provided along the signal line 20 at intervals of less than about one quarter of the wavelength of a high-frequency signal to be transmitted through the signal line 20, for example.

Furthermore, in the high-frequency signal line 10, the characteristic impedance Z3 at each end of the signal line 20 has a value between the characteristic impedance Z1 of the signal line 20 in the area A1 and the characteristic impedance Z2 of the signal line 20 in the area A2. Accordingly, in the signal line 20, a standing wave with a short wavelength is more likely to be generated between the bridge portions 60, and a standing wave with a long wavelength is less likely to be generated between both ends of the signal line 20. Thus, the high-frequency signal line 10 renders it possible to significantly reduce or prevent low-frequency noise generation more effectively.

Further, the high-frequency signal line 10 renders it possible to significantly reduce or prevent high-frequency signal transmission loss, as will be described below. More specifically, the line portions 20b of the signal line 20 overlap with the openings 30, and therefore, are not positioned opposite to the ground conductor 24. Accordingly, little capacitance is generated between the line portion 20b and the ground conductor 24. Therefore, the width Wb of the line portion 20b can be set greater than the width Wa of the line portion 20a without causing the characteristic impedance of the line portion 20b to vary significantly. Thus, the resistance value of the signal line 20 is reduced, resulting in reduced high-frequency signal transmission loss.

Still further, the high-frequency signal line 10 preferably is reduced in thickness. More specifically, the ground conductor 24 has the openings 30 provided therein. Accordingly, little capacitance is generated between the signal line 20 and the ground conductor 24. Therefore, even if the distance D2 between the signal line 20 and the ground conductor 24 in the z-axis direction is reduced, it is still possible to prevent the capacitance between the signal line 20 and the ground conductor 24 from becoming excessively high. That is, it is possible to reduce the distance D2 between the signal line 20 and the ground conductor 24 in the z-axis direction while maintaining the characteristic impedance of the signal line 20 at a predetermined impedance value. Thus, the high-frequency signal line 10 can be reduced in thickness. The thinner the high-frequency signal line 10 becomes, the more readily the high-frequency signal line 10 can be bent.

Yet further, in the high-frequency signal line 10, the shortest distance D3 between the line portion 20a and the reinforcing conductor 26 or 28 is greater than the shortest distance D2 between the line portion 20a and the bridge portion 60 of the ground conductor 24, as shown in FIG. 3. Accordingly, the capacitance generated between the signal line 20 and the reinforcing conductor 26 or 28 is greater than the capacitance generated between the signal line 20 and the ground conductor 24. In particular, in the high-frequency signal line 10, the principal faces of the signal line 20 are not positioned opposite to any of the principal surfaces of the reinforcing conductors 26 and 28, and therefore, the capacitance generated between the signal line 20 and the reinforcing conductor 26 or 28 is extremely low. Accordingly, the characteristic impedance of the signal line 20 depends on the capacitance generated between the signal line 20 and the ground conductor 24 but barely depends on the capacitance generated between the signal line 20 and the reinforcing conductor 26 or 28. Thus, the characteristic impedance of the signal line 20 is barely affected either by the reinforcing conductors 26 and 28 being oxidized by moisture entering the gap between the dielectric sheets 18b and 18c or by the reinforcing conductor 26 or 28 being cracked.

Yet further, in the high-frequency signal line 10, the provision of the reinforcing conductors 26 and 28 causes the characteristic impedance of the signal line 20 to vary only slightly, and therefore, the high-frequency signal line 10 can be designed without significantly changing the configuration of a high-frequency signal line not provided with the reinforcing conductors 26 and 28.

Yet further, in the high-frequency signal line 10, the reinforcing conductors 26 and 28 are positioned on opposite sides of the signal line 20 in the y-axis direction and are kept at a ground potential. Accordingly, noise radiation from the signal line 20 toward the opposite sides in the y-axis direction is absorbed into the reinforcing conductors 26 and 28. Moreover, noise entering the laminate 12 from opposite sides in the y-axis direction is also absorbed into the reinforcing conductors 26 and 28. Thus, both noise radiation from the high-frequency signal line 10 and noise entry into the high-frequency signal line 10 are significantly reduced or prevented.

Yet further, the high-frequency signal line 10 provides high moisture resistance. More specifically, in the high-frequency signal line 10 shown in FIG. 2, liquid crystal polymer molecules in the dielectric sheets 18 are oriented so as to extend in the x-axis or y-axis direction. In such a case, moisture is unlikely to enter the laminate 12 from the top and bottom surfaces, but from the opposite side surfaces of the laminate 12 in the y-axis direction. Therefore, the high-frequency signal line 10 has the reinforcing conductors 26 and 28 provided on the opposite sides of the signal line 20 in the y-axis direction. Accordingly, the thickness of the laminate 12 in the z-axis direction is uniform or approximately uniform, so that pressure is applied uniformly across the entire laminate 12 at the time of the pressure bonding of the laminate 12, such that the dielectric sheets 18 are bonded firmly. Thus, moisture entry from the opposite side surfaces of the laminate 12 in the y-axis direction is significantly reduced or prevented, resulting in high moisture resistance.

Yet further, in the high-frequency signal line 10, the width Wa of the signal line 20 in the area A2 is less than the width Wb of the signal line 20 in the area A1. Thus, the capacitance generated between the signal line 20 and the bridge portion 60 in the area A2 is prevented from becoming excessively high.

First Modification

Figure 9:
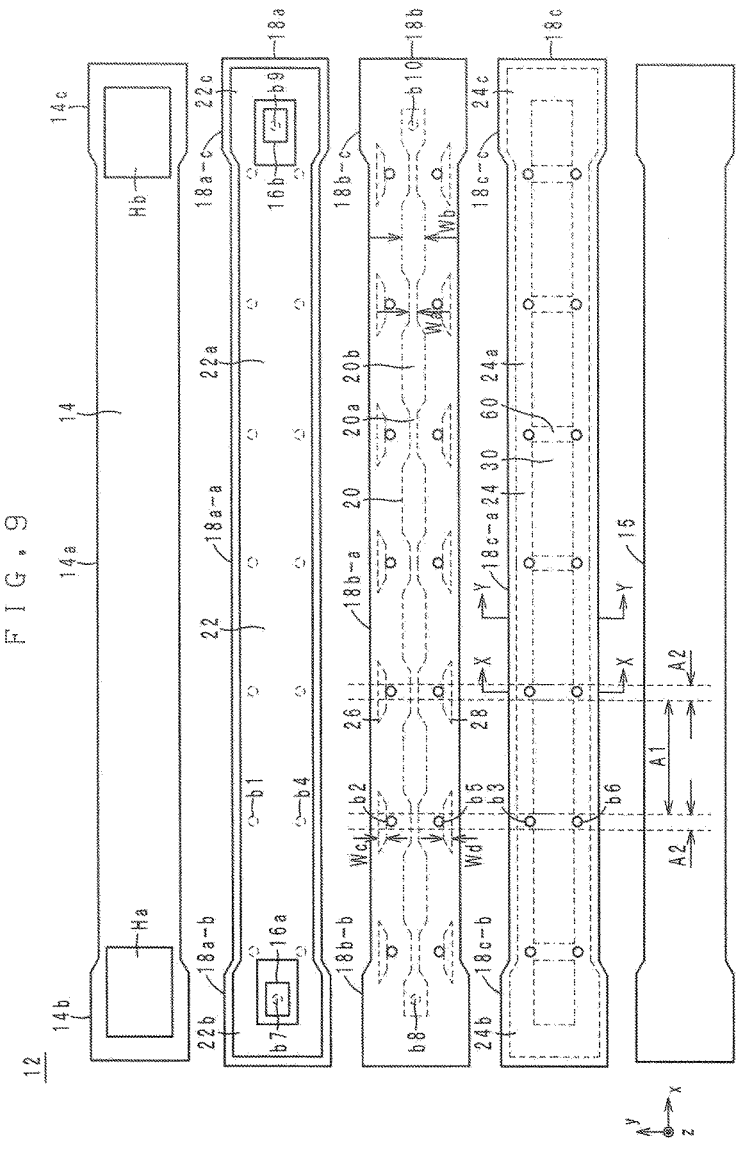
FIG. 9 is an exploded view of a high-frequency signal line according to a first modification of a preferred embodiment of the present invention.

Hereinafter, a high-frequency signal line 10a according to a first modification of a preferred embodiment of the present invention will be described with reference to the drawings. FIG. 9 is an exploded view of a high-frequency signal line 10a according to the first modification.

The high-frequency signal line 10a differs from the high-frequency signal line 10 in the shape of the reinforcing conductors 26 and 28. The reinforcing conductors 26 and 28 of the high-frequency signal line 10a preferably have a trapezoidal or substantially trapezoidal shape, for example. More specifically, the line portion 20a is tapered toward opposite ends in the x-axis direction. Accordingly, the reinforcing conductors 26 and 28 are slanted at both ends in the x-axis direction so as to accord with the shape of the opposite ends of the line portion 20a. The opposite ends of the line portion 20a in the x-axis direction coincide with the opposite ends of each of the reinforcing conductors 26 and 28 in the x-axis direction when they are viewed in a plan view in the y-axis direction. Therefore, the mother sheet 118b becomes more uniform in strength to a tensile force applied in the x-axis direction at the time of the production of the high-frequency signal line 10a. Thus, the signal line 20 is prevented from being broken by stress being concentrated on a portion of the signal line 20 during the winding of the mother sheet 118a.

Second Modification

Figure 10:
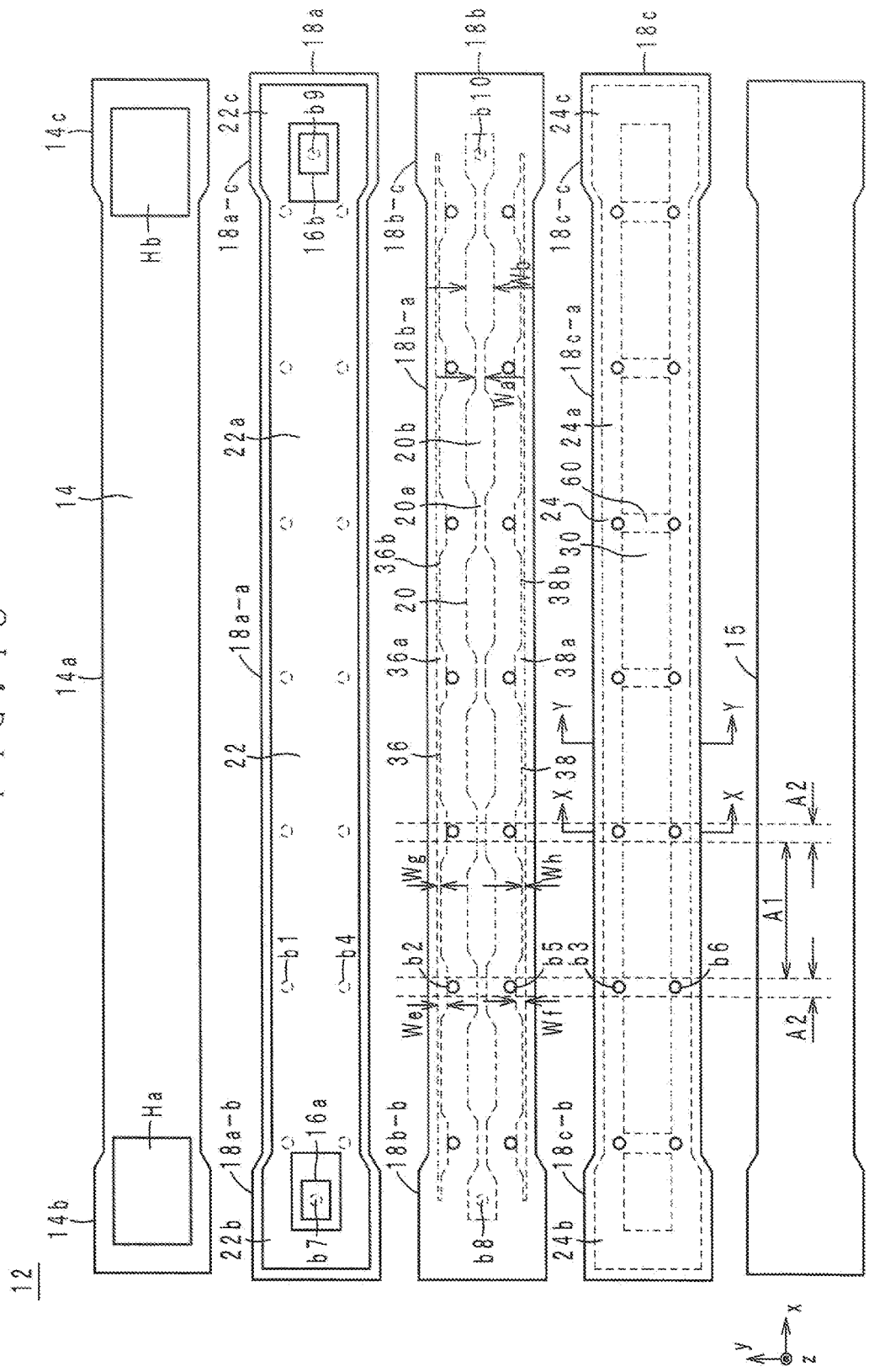
FIG. 10 is an exploded view of a high-frequency signal line according to a second modification of a preferred embodiment of the present invention.
Figure 11:
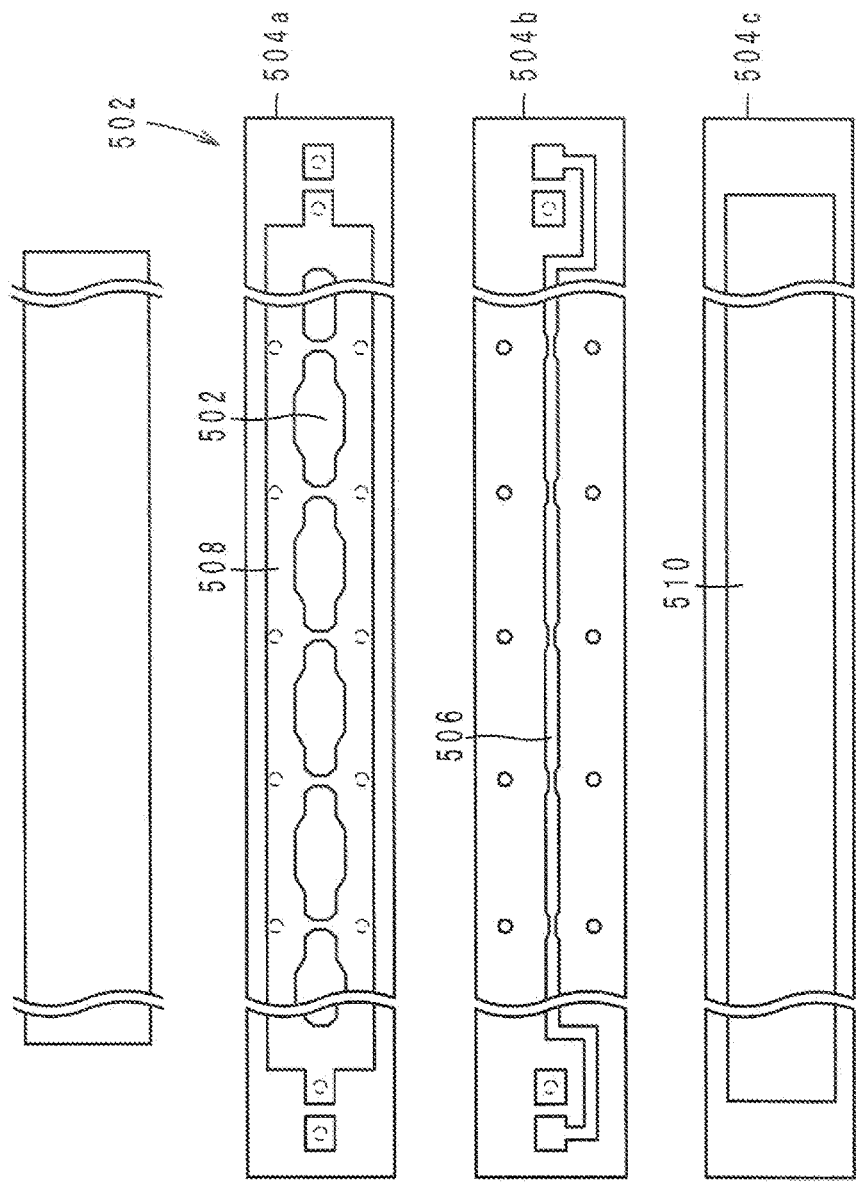
FIG. 11 is an exploded view of a high-frequency signal line described in Japanese Utility Model No. 3173143.

Hereinafter, a high-frequency signal line 10b according to a second modification of a preferred embodiment of the present invention will be described with reference to the drawings. FIG. 10 is an exploded view of the high-frequency signal line 10b according to the second modification.

The high-frequency signal line 10b differs from the high-frequency signal line 10a in that reinforcing conductors 36 and 38 are provided in place of the reinforcing conductors 26 and 28.

The reinforcing conductor 36 is a linear conductor provided on the bottom surface of the dielectric sheet 18b along the signal line 20 and positioned on the positive side in the y-axis direction relative to the signal line 20. The reinforcing conductor 36 includes reinforcing portions 36a and 36b. The reinforcing portion 36a is provided along the line portion 20a. The reinforcing portion 36b is provided along the line portion 20b. The reinforcing portion 36a has a width We. The reinforcing portion 36b has a width Wg. The width Wg is less than the width We. Moreover, the reinforcing portion 36a is slanted at both ends in the x-axis direction so as to accord with the shape of the opposite ends of the line portion 20a in the x-axis direction.

The reinforcing conductor 38 is a linear conductor provided on the bottom surface of the dielectric sheet 18b along the signal line 20 and positioned on the negative side in the y-axis direction relative to the signal line 20. The reinforcing conductor 38 includes reinforcing portions 38a and 38b. The reinforcing conductor 38 is positioned on the opposite side of the signal line 20 from the reinforcing conductor 36, i.e., in the present preferred embodiment, on the negative side y-axis direction relative to the signal line 20. The reinforcing portion 38a is provided along the line portion 20a. The reinforcing portion 38b is provided along the line portion 20b. The reinforcing portion 38a has a width Wf. The reinforcing portion 38b has a width Wh. The width Wh is less than the width Wf. Moreover, the reinforcing portion 38a is slanted at both ends in the x-axis direction so as to accord with the shape of the opposite ends of the line portion 20a in the x-axis direction.

Furthermore, the total of the width Wa of the line portion 20a, the width We of the reinforcing portion 36a, and the width Wf of the reinforcing portion 38a is equal or approximately equal to the total of the width Wb of the line portion 20b, the width Wg of the reinforcing portion 36b, and the width Wh of the reinforcing portion 38b.

In the method for producing the high-frequency signal line 10b thus configured, while a mother sheet 118b coated with copper foil (conductor film) is being fed from a supply roller 310 to be wound up on a take-up roller 312, the copper foil is patterned between the supply roller 310 and the take-up roller 312, such that a signal line 20 and reinforcing conductors 36 and 38 are formed on the mother sheet 118b, as shown in FIG. 10. Note that other production steps for the high-frequency signal line 10b are the same as those for the high-frequency signal line 10, and therefore, any descriptions thereof will be omitted.

As with the high-frequency signal line 10, the high-frequency signal line 10b thus configured renders it possible to significantly reduce or prevent the occurrence of breakage in the signal line 20.

Further, the high-frequency signal line 10b includes the reinforcing conductors 36 and 38 provided along the entire length of the signal line 20. Thus, the high-frequency signal line 10b provides further improved moisture resistance.

Other Preferred Embodiments

The present invention is not limited to the high-frequency signal lines 10, 10a, and 10b and the methods for producing base layers with signal lines according to the above preferred embodiments, and variations can be made within the spirit and scope of the invention.

Note that the high-frequency signal lines 10 and 10a may only include either one of the reinforcing conductors 26 and 28. Similarly, the high-frequency signal line 10b may only include either one of the reinforcing conductors 36 and 38.

Further, in the high-frequency signal lines 10, 10a, and 10b, the reinforcing conductors 26, 28, 36, and 38 do not have to be connected to the via-hole conductors b1, b2, b3, and b4.

In the high-frequency signal lines 10, 10a, and 10b, the dielectric sheets 18a to 18c have conductors provided on only one principal surface, but the dielectric sheets 18a to 18c may have conductors provided on both principal surfaces.

Further, in the high-frequency signal lines 10, 10a, and 10b, the ground conductor layer 22 may be provided on the bottom surface of the dielectric sheet 18a. In addition, the signal line 20 and the reinforcing conductors 26, 28, 36, and 38 may be provided on the top surface of the dielectric sheet 18b, and the ground conductor 24 may be provided on the top surface of the dielectric sheet 18c.

Still further, the high-frequency signal lines 10, 10a, and 10b do not have to be provided with the ground conductors 22 and 24.

Yet further, the configurations of the high-frequency signal lines 10, 10a, and 10b may be used in combination.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line, comprising:
  a first base layer having flexibility;
  a linear signal line provided on the first base layer and including a first line portion having a first width and a second line portion having a second width greater than the first width; and
  a first reinforcing conductor provided on the first base layer along the first line portion; wherein
  the first reinforcing conductor does not extend entirely along the second line portion.

2. The high-frequency signal line according to claim 1, further comprising a first ground conductor positioned opposite to the signal line.

3. The high-frequency signal line according to claim 2, wherein
  the first and second line portions are arranged so as to alternate with each other; and
  the first ground conductor includes a plurality of openings overlapping with the second line portions.

4. The high-frequency signal line according to claim 3, wherein a shortest distance between the first line portion and the first reinforcing conductor is greater than a shortest distance between the first line portion and the first ground conductor.

5. The high-frequency signal line according to claim 2, further comprising a second ground conductor provided on the other side from the first ground conductor with the signal line positioned therebetween and opposed to the second ground conductor.

6. The high-frequency signal line according to claim 1, further comprising a second reinforcing conductor provided on the first base layer along the first line portion so as to be positioned on the other side from the first reinforcing conductor with the signal line positioned therebetween.

7. The high-frequency signal line according to claim 6, wherein a total of the first width, a width of the first reinforcing conductor, and a width of the second reinforcing conductor is equal or approximately equal to the second width.

* * * * *